(12) United States Patent
Evans et al.

(10) Patent No.: US 7,127,017 B1
(45) Date of Patent: Oct. 24, 2006

(54) CLOCK RECOVERY CIRCUIT WITH SECOND ORDER DIGITAL FILTER

(75) Inventors: William P. Evans, Catonsville, MD (US); C. Thomas Gray, Apex, NC (US); Scott Huss, Cary, NC (US)

(73) Assignee: Rambus, Inc., Los Altos, CA (US)

( * ) Notice: Subject to any disclaimer, the term of this patent is extended or adjusted under 35 U.S.C. 154(b) by 617 days.

(21) Appl. No.: 10/198,899

(22) Filed: Jul. 19, 2002

(51) Int. Cl.
*H04L 7/00* (2006.01)

(52) U.S. Cl. ........................ 375/355; 375/376

(58) Field of Classification Search ............... 375/371, 375/373, 3, 555, 232, 2, 25, 355, 376; 327/141–161
See application file for complete search history.

(56) References Cited

U.S. PATENT DOCUMENTS

| | | | |
|---|---|---|---|
| 4,373,181 A | 2/1983 | Chisholm et al. | |
| 4,684,831 A | 8/1987 | Krues | |
| 4,787,082 A | 11/1988 | Delaney et al. | |
| 4,797,635 A | 1/1989 | Hatcher | |
| 5,329,559 A * | 7/1994 | Wong et al. ............... | 375/373 |
| 5,382,921 A | 1/1995 | Estrada et al. | |
| 5,448,598 A | 9/1995 | Yousefi et al. | |
| 5,485,113 A | 1/1996 | Ito et al. | |
| 5,485,490 A | 1/1996 | Leung et al. | |
| 5,499,273 A * | 3/1996 | Kull et al. ................. | 375/355 |
| 5,533,072 A | 7/1996 | Georgiou et al. | |
| 5,548,280 A | 8/1996 | Pearce | |
| 5,550,860 A | 8/1996 | Georgiou et al. | |
| 5,574,454 A * | 11/1996 | Wilson et al. ............. | 341/143 |
| 5,578,939 A | 11/1996 | Beers et al. | |
| 5,587,675 A | 12/1996 | Schmitt | |
| 5,592,629 A | 1/1997 | Gamble | |
| 5,598,443 A | 1/1997 | Poeppleman | |

(Continued)

FOREIGN PATENT DOCUMENTS

EP 0 285 413 A2 5/1988

(Continued)

OTHER PUBLICATIONS

Alexander, J D. H., "*Clock Recovery from Random Binary Signals, Electronic Letters*", Oct. 30, 1975, pp. 541-542, vol. 11, No. 22, The Institute of Electrical Engineers, U.K.

(Continued)

*Primary Examiner*—Tesfaldet Bocure
(74) *Attorney, Agent, or Firm*—Bingham McCutchen LLP (57) ABSTRACT

The present invention provides a method and mechanism for regenerating the clock signal and recovering the data of a serial bit data stream. According to an embodiment, a circuit for recovering data from a serial bit stream may include a de-serializer configured for reclocking the serial bit stream using at least one reclocking signal, having a frequency with a phase, and de-serializing the serial bit stream into at least two bit streams. The circuit may further include a clock recovery loop filter having a second order filter coupled with the deserializer. The clock recovery loop filter may be configured for determining whether the de-serializer is reclocking the serial bit data stream at an optimum location and for generating at least one control signal to adjust the phase of the frequency of the at least one reclocking signal if the de-serializer is not reclocking the serial bit data stream at the optimum location. The circuit may also include a phase interpolator coupled with the clock recovery loop filter and the de-serializer, configured for generating the at least one reclocking signal in accordance with the at least one control signal.

25 Claims, 10 Drawing Sheets

U.S. PATENT DOCUMENTS

| | | | |
|---|---|---|---|
| 5,623,518 | A | 4/1997 | Pfiffner |
| 5,633,899 | A | 5/1997 | Fielder et al. |
| 5,638,028 | A | 6/1997 | Voth |
| 5,818,304 | A | 10/1998 | Hogeboom |
| 5,844,436 | A | 12/1998 | Altmann |
| 5,878,088 | A * | 3/1999 | Knutson et al. ............ 375/324 |
| 6,002,279 | A * | 12/1999 | Evans et al. ................ 327/144 |
| 6,067,319 | A * | 5/2000 | Copeland .................... 375/232 |
| 6,137,375 | A | 10/2000 | Li |
| 6,831,523 | B1 * | 12/2004 | Pastorello et al. ............ 331/25 |
| 2003/0031283 | A1 * | 2/2003 | Bronfer et al. ............. 375/371 |
| 2003/0112031 | A1 * | 6/2003 | Agrawal et al. .............. 326/41 |
| 2004/0042544 | A1 * | 3/2004 | Mejia ......................... 375/225 |
| 2005/0084002 | A1 * | 4/2005 | Agazzi et al. .............. 375/220 |

FOREIGN PATENT DOCUMENTS

| | | | |
|---|---|---|---|
| EP | 0-523-885 | * | 1/1993 |

OTHER PUBLICATIONS

American National Standard for Information Systems, "*Fibre Channel—Physical and Signaling Interface (FC-PH) Rev. 4.3*", proposed working draft, Jun. 1, 1994, USA.

Applied Micro Circuits Corporation, "*Preliminary Device Specification for Fibre Channel and Gigabit Ethernet Transceivers S2053 and S2054*", Feb. 3, 1998.

Applied Micro Circuits Corporation,"*Fibre Channel Products*", 1996.

CERN Fibre Channel homepage, available in 1999 at http://www.cern.ch/HSI/fcs/fcs.html.

Fibre Channel Association, "*Welcome to the FCA Server*", May 23, 1997.

Jurgens, C., "*Fibre Channel: A Connection of the Future*", Computer, vol. 28, No. 8, Aug. 1995.

"*Fiber Channel Components*", Electronic Components, Hewlett Packard, 1995.

Gore CuGLM™, "*Copper Gigabaud Link*", Module FCN 7181, Aug. 1997.

Margarit, M. A. et al., "*A Low-Noise, Low-Power VCO with Automatic Amplitude Control for Wireless Applications*", IEEE Journal of Solid-State Circuits, Jun. 1999, pp. 761-777, vol. 34, No. 6.

Meggyesi, Z., "*Fibre Channel Overview*", available in 1999 at http://www1.cern.ch/HSI/fcs/spec/overview.htm.

Nelson, C., "*Fiber Channel Offers Speed, Interoperability*", EE Times—Communications Design, CMP Media Inc., available in 1999, http://techweb.cmp.com/eet/nick/corndesign/fibercha.html.

Partovi, H., et al., "*A 62.5 Gb/s Multi-Standard SerDes IC*", Proceedings of the IEEE 2003 Custom Integrated Circuits Conference, Sep. 21-24, 2003, pp. 585-588, USA.

"*SFI-4 (OC-192 Serdes-Framer Interface) OIF-PLL-02.0—Proposal for a Common Electrical Interface Between SONET Framer and Serializer/Deserializer Parts for OC-192 Interfaces*", Optical Internetworking Forum, OIF-SF14-01.0 Implementation Agreement, Sep. 26, 2000.

Shafire, H., "*Gigibit Networking Technologies Converge*", Part 4, Communications Design, CMP Media, Inc., available in 1999 from http://techweb.cmp.com/ee/nick/comdesign/gigabito.html.

Unisys Corporation, "*Fibre Channel White Paper*", 1996.

Vitesse Semiconductor Corporation, "*Advance Product Information (Draft)*", Oct. 19, 1995, pp. 1-13, USA.

VLSI Technology, Inc., "*Fibre Channel ENDEC+*", Product Bulletin, Aug. 1995, USA.

Webstart Communications, "*Computer and Communication Standards and Cross References*", available in 1999 at http://www.cmpcmm.com/cc/standards.html.

* cited by examiner

CLOCK RECOVERY CIRCUIT WITH SECOND ORDER DIGITAL FILTER

BACKGROUND AND SUMMARY

Figure 1:
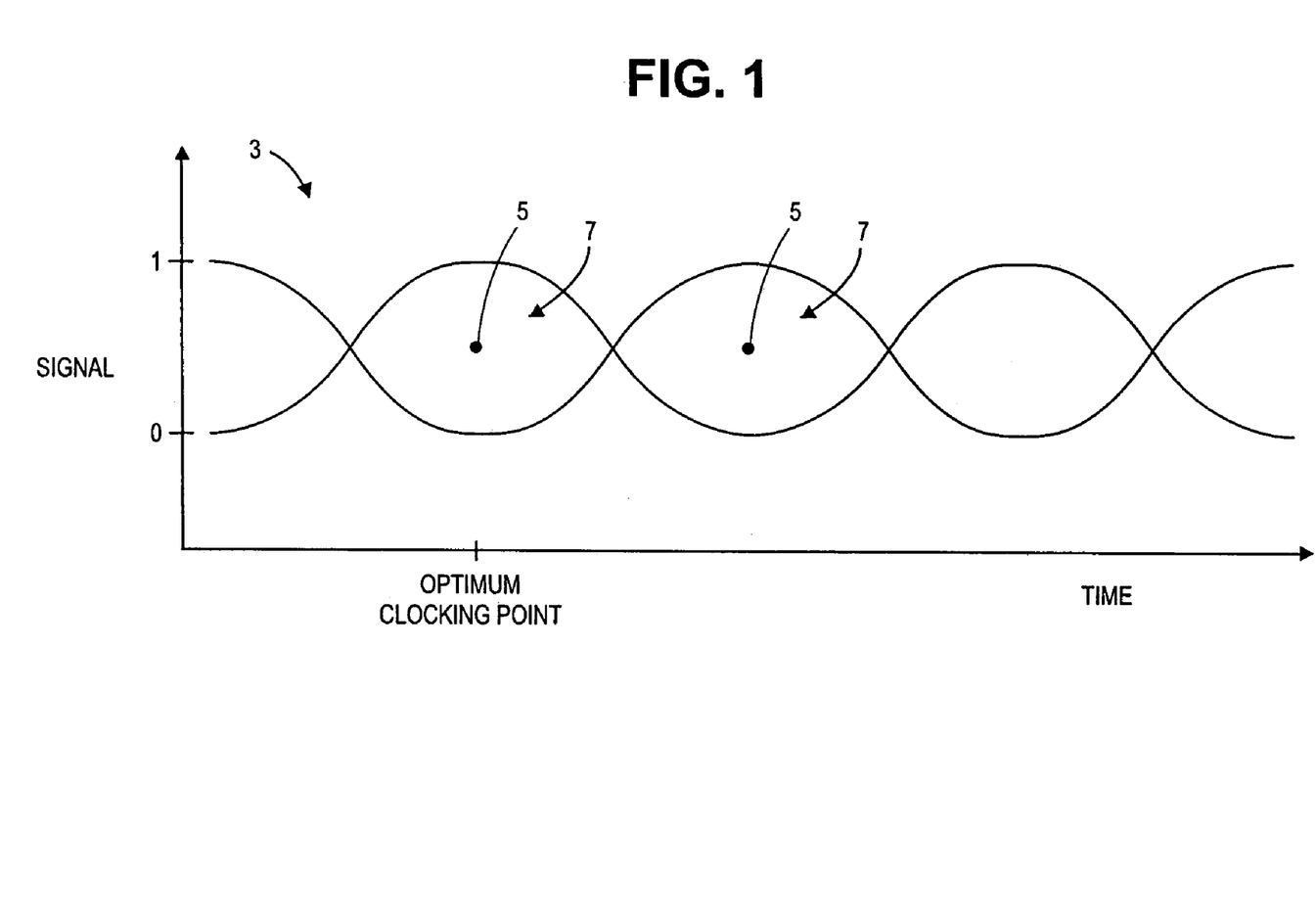
FIG. 1 is a graph illustrating an example serial bit data stream.

As the performance of integrated circuits (ICs) increases, so does the amount of data transferred between ICs. The industry trend has been to transfer the data serially at very high speeds, e.g., transfer rates in excess of 1 Gigabit/second. Generally, when transferring data serially at these high speeds from a first IC to a second IC, the clock data needed to reclock the serial bit stream at the second IC is not included with the data being transferred. One approach to recover the data from the serial bit stream is to include circuitry on the second IC to regenerate the clock and recover the data. This circuitry is often referred to as a "clock recovery circuit." Turning to FIG. 1, the serial bit stream of data, i.e., 1's and 0's, is generally comprised of a sinusoidal type signal 3. If the signal 3 is overlapped onto itself, an "eye" shape 7 is formed. Generally, the optimum point within the signal 3 to determine whether the data is a 1 or a 0 with the least amount of error is at the center 5 of the eye 7. The clock recovery circuit recovers the data by reclocking the signal 3 at as close to the center 5 of the eye 7 as possible.

One approach to performing the clock recovery is to use an analog voltage controlled oscillator (VCO) in a phase locked loop (PLL) to generate the recovered clock. In the case of multiple data streams, a disadvantage of this approach is that a VCO and a PLL is required for each input, which may consume a significant amount of area on a circuit board. Further, multiple VCOs on an IC may also increase the probability of injection locking where the VCOs will lock together.

The present invention provides a method and mechanism for regenerating the clock signal and recovering the data of a serial bit data stream. According to an embodiment, a circuit for recovering data from a serial bit stream may include a de-serializer configured for reclocking the serial bit stream using at least one reclocking signal, having a frequency with a phase, and de-serializing the serial bit stream into at least two bit streams.

The circuit, according to an embodiment, further includes a clock recovery loop filter having a second order filter coupled with the deserializer. The clock recovery loop filter may be configured for determining whether the de-serializer is reclocking the serial bit data stream at an optimum location and for generating at least one control signal to adjust the phase and frequency of at least one reclocking signal if the de-serializer is not reclocking the serial bit data stream at the optimum location. The circuit may also include a phase interpolator coupled with the clock recovery loop filter and the de-serializer, configured for generating the at least one reclocking signal in accordance with the at least one control signal.

According to another embodiment, a method for recovering data from a serial bit data stream may include regenerating at least one reclocking signal, having a frequency with a phase, to reclock the serial bit data stream; determining whether the at least one reclocking signal is reclocking the serial bit data stream at an optimum point within the serial bit data stream; if there is a frequency offset between the at least one reclocking signal and the serial bit data stream and if the serial bit data stream locks onto one value, then storing the frequency offset; and generating at least one control signal to adjust the phase of the frequency of the at least one reclocking signal to reclock at substantially near the optimum point.

Further aspects, objects, and advantages of the invention are described below in the detailed description, drawings, and claims.

BRIEF DESCRIPTION OF THE DRAWINGS

The accompanying drawings are included to provide a further understanding of the invention and, together with the Detailed Description, serve to explain the principles of the invention.

DETAILED DESCRIPTION

The present invention is disclosed in a number of embodiments as methods and mechanisms for recovering the data of a serial data stream. Some of the embodiments described are directed to digital clock recovery filters. However, the principles presented here are applicable to any type of clock recovery filter, such as analog clock recovery filters, and thus the scope of the invention is not to be limited to the exact embodiments shown herein.

Figure 2:
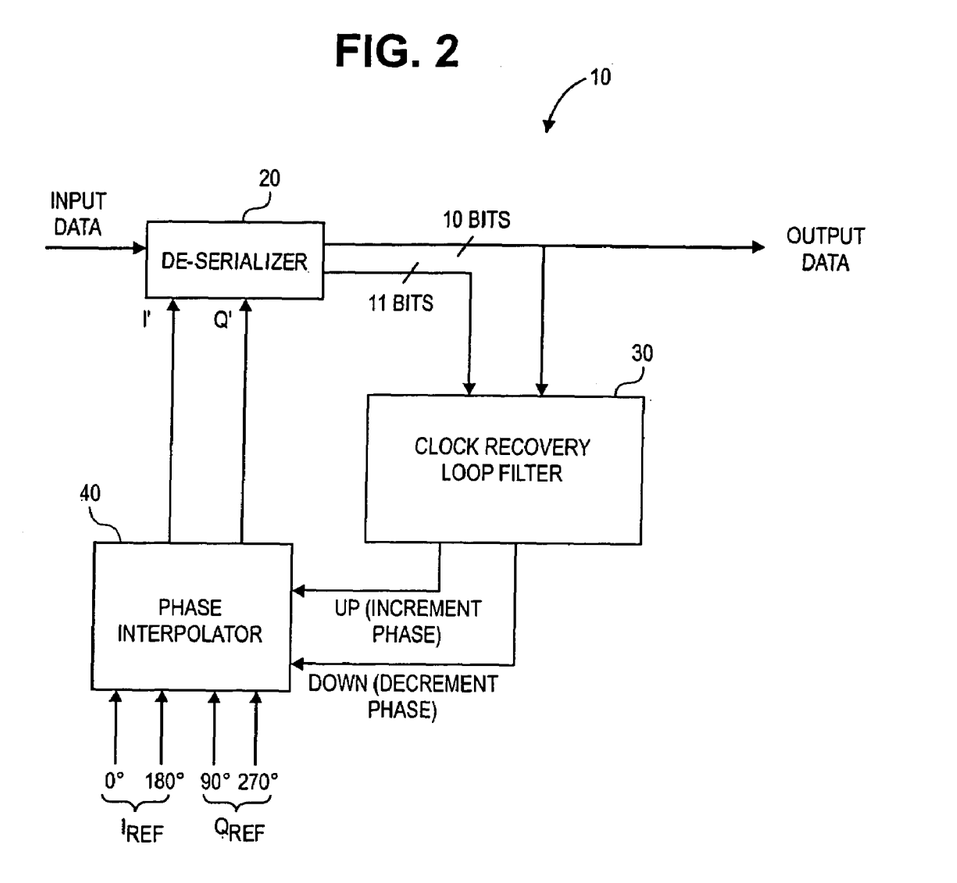
FIG. 2 is a diagram of a clock recovery circuit in accordance with an embodiment of the present invention.

As described above, in order to recover data from a serial bit data stream, the data stream may need to be reclocked. A clock recovery circuit can be used by an IC to reclock the data stream and recover the data. Turning to FIG. 2, a clock recovery circuit 10 in accordance with an embodiment of the present invention is shown. The circuit 10 includes a de-serializer 20, which receives serial input data, reclocks the data, and generates a corresponding de-serialized output data. The de-serializer 20 is coupled with a clock recovery loop filter 30, which analyzes whether the de-serializer 20 is reclocking the input data at the optimum location, e.g., close to the center of the eye, as mentioned above. The clock recovery loop filter 30 is coupled with a phase interpolator 40 which adjusts the phase of the reclocking signal, I' and Q', used by the de-serializer 20.

Figure 3:
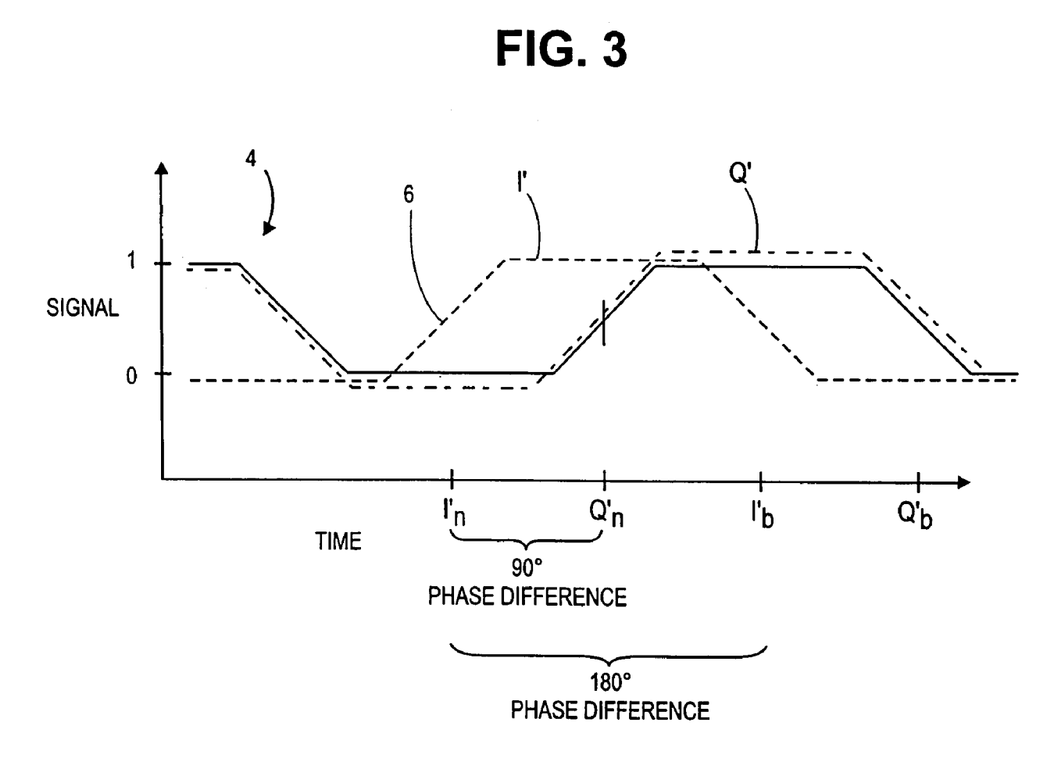
FIG. 3 is a graph illustrating ideal reclocking points along an example serial bit data stream.

When the clock recovery circuit 10 receives the input data, the de-serializer 20 reclocks the data with two reclocking signals, in-phase (I') and quadrature (Q'), that have a 90° phase difference and are each approximately half the frequency of the input data frequency. For example, if the input data frequency is around 1 GHz, then I' and Q' have a frequency of approximately 500 MHz. Turning to FIG. 3, a graph illustrating the intended behavior of I' and Q' in an embodiment is shown. Both the upward transition, I'n, and the downward transition, I'b, of I' are intended to occur at the center 6 of the data signal 4, shown as an ideal signal as an example, and both the upward transition, Q'n, and the downward transition, Q'b, of Q' are intended to occur at the transition points of the data signal 4 as the data signal swings from 1 to 0 or vice versa. The upward and downward transitions of each reclocking signal, I' and Q', and are separated by 180° phase, and since I' and Q' are apart by 90° in phase from each other, then if I'n is at 0°, Q'n is at 90°, I'b is at 180°, and Q'b is at 270°.

Figure 4:
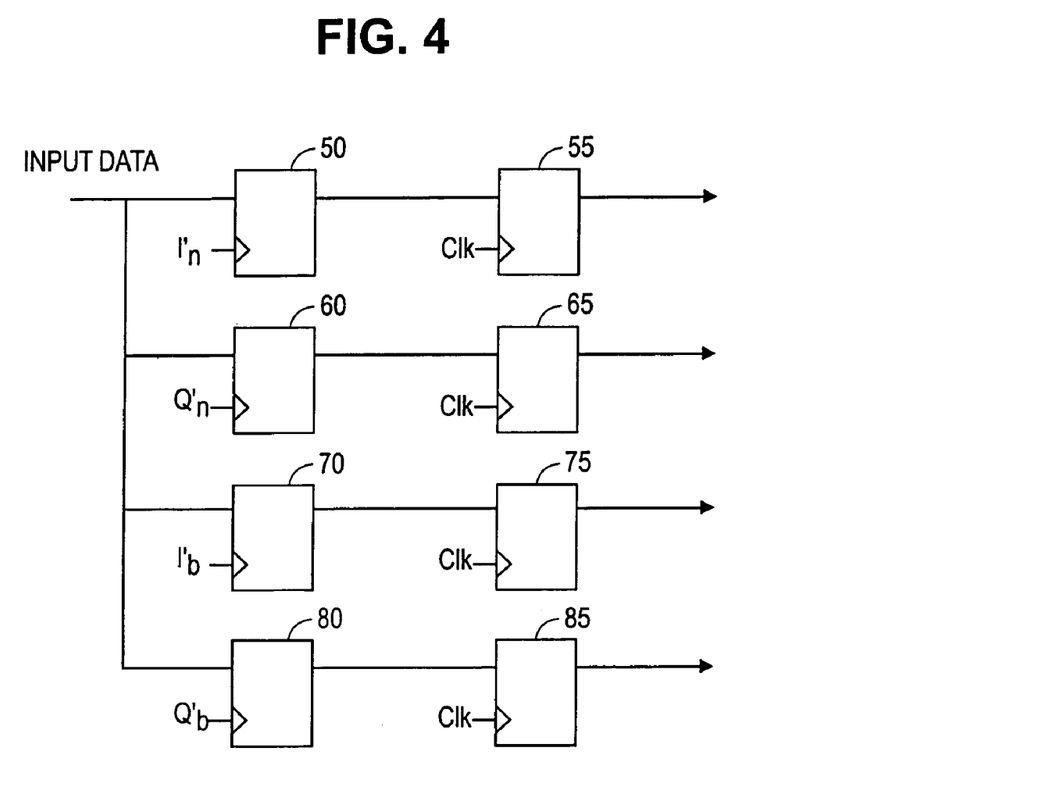
FIG. 4 is a diagram of a de-serializing circuit in accordance with an embodiment of the present invention.

Each of the reclocking signal's transitions, I'n, I'b, Q'n, and Q'b, trigger a flip-flop circuit, 50, 60, 70, 80, as shown in FIG. 4. The value of the input data signal is entered into flip-flop 50 when I' is on an upward transition, I'n, and entered into flip-flop 70 when I' is on a downward transition, I'b. The value of the input data signal is entered into flip-flop 60 when Q' is on an upward transition, Q'n, and entered into flip-flop 80 when Q' is on a downward transition, Q'b. The value of the data in flip-flops 50 and 70 represent the value of the input data, i.e., whether the data is a 1 or a 0. The value of the data in flip-flops 60 and 80 represent the transition points of the input data as the input data swings back and forth from 1 to 0. Subsequently, the data in flip-flops 50, 60, 70, and 80 are synchronized by entering flip-flops 55, 65, 75, 85 controlled by a single clock signal, Clk.

Figure 5:
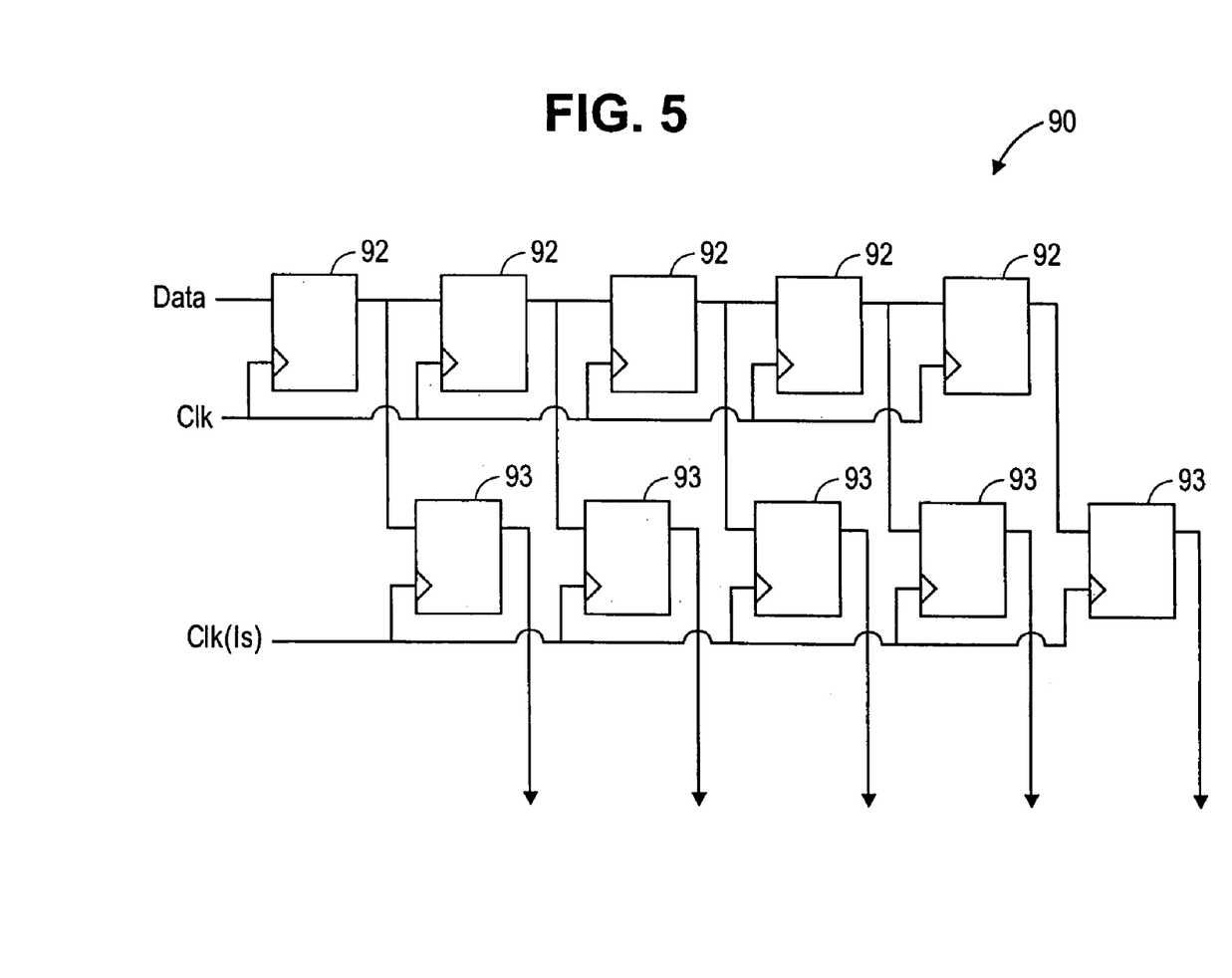
FIG. 5 is a diagram of another de-serializing circuit in accordance with an embodiment of the present invention.

In effect, the flip-flop circuitry in FIG. 4 performs a 1 to 2 deserialization, where the serial data is de-serialized into two parallel data streams coming out of flip-flops 55 and 75 which may be reclocked at half the frequency of the input data stream. The data streams coming out of flip-flops 55, 65, 75, and 85 may further be de-serialized by a clock signal with a lower frequency. For example, each data stream coming out of flip-flops 55, 65, 75, and 85 may be coupled to a flip-flop circuit 90 shown in FIG. 5, which performs a 1 to 5 deserialization. The data enters flip-flops 92 via the clock signal, Clk. Flip-flops 92 then feed data into flip-flops 93 via a lower speed clock signal Clk(ls), which may have a frequency that is 1/5 that of Clk. Thus, with the circuits in FIGS. 4 and 5 the de-serializer 20 may de-serialize serial input data having a frequency of 1 GHz into 21 parallel streams of data—10 bits representing the output data, i.e., the input data from I'n and I'b, and 11 bits representing the transition points of the input data from Q'n and Q'b—having a substantially lower frequency, e.g., around 100 MHz, which allows high frequency jitter or noise to be filtered out of the input data.

Referring to FIG. 2, the 21 parallel streams of data are coupled to the clock recovery loop filter 30, which determines whether the reclocking signals, I' and Q', are reclocking the input data at the optimum point or the point with the least bit error rate (BER), i.e., the center 5 of the eye 7. Referring to FIG. 3, one approach to determine whether I' and Q' are reclocking the input data at the optimum point is to analyze the input data at I'n, Q'n, and I'b, which are clocked into flip-flops 50, 60, and 70, respectively, referring to FIG. 4. The values at I'n, Q'n, and I'b may indicate whether to increase the phase of the reclocking signals or decrease the phase—referring to FIG. 3, shift the reclocking signals to the left or to the right. For example, if the input data reclocked at I'n, Q'n, and I'b have the values, 0, 0, 1, respectively, then the phase of the reclocking signals may be too far to the left, because if the input data at Q'n is 0, then Q'n may be reclocking the earlier data and not the transition point of the data. Thus, the phase of the reclocking signals, I' and Q', may have to increase or go up. Likewise, if I'n, Q'n, and I'b have the values 0, 1, 1 respectively, then the phase of the reclocking signals may be too far to the right, because if the input data at Q'n is 1, then Q'n again may be reclocking the later data and not the transition point of the data. Thus, the phase of the reclocking signals, I' and Q', may have to decrease or go down.

One approach to determining whether the phase of the reclocking signals needs to go up or down is to include a clock recovery loop filter 30, as shown in FIG. 2. The clock recovery loop filter 30 generally determines whether the phase of the reclocking signals needs to increase or decrease, filters the information, and accordingly generates control signals for the phase interpolator 40 to increase or decrease the phase. The clock recovery loop filter 30 may include a first order digital loop, an example of which is described in U.S. Pat. No. 6,002,279, entitled "Clock Recovery Circuit", issued to Evans et al. Generally, the first order loop generates control signals for the phase interpolator 40 to increase or decrease the phase of the reclocking signals, I' and Q'. The rate that the first order loop generates the control signals depends in part on how far the phase of the reclocking signals is from the optimum point.

However, in the case where the frequency of the reclocking signals is offset from the frequency of the input data, a limitation arises. Even if the reclocking signals are generated from a precision reference such as a quartz crystal, as will be described in more detail below, the frequency of the reclocking signals may still be slightly offset from the input data. In such a case, the reclocking signals I' and Q' will slightly deviate from the optimum point for reclocking.

If the input data continually swings from one value to another, i.e., from 1 to 0 and back to 1 again, transition points will be continually created, and thus the first order loop will be able to keep track of the deviation or offset and continue to generate control signals for the phase interpolator 40 that will adjust the reclocking signals to as close to the optimum point as possible. However, if the input data does not swing, but instead generates only one value for a long period of time, e.g., generates only 1' or 0's, then the first order loop will be unable to keep track of the deviation since there are no transitions in the input data, i.e., Q' will either stay at 1 or stay at 0.

Further, because there may be an offset between the frequency of the reclocking signals, I' and Q', and the frequency of the input data, the input data's constant generation of one value will cause the first order loop to generate no control signals that will allow the phase of the data to either continually increase or continually decrease relative to the phase of the reclocking signals. If the relative phase of the reclocking signal continues to increase or decrease, then the phase could potentially shift 360° from the reclocking signals' original phase, which causes the frequency of the reclocking signals to shift from the original frequency. Thus, the reclocking signals I' and Q' may be reclocking the input data at a different frequency than the original reclocking frequency and may deviate further from the optimum point. Thus, the first order loop may cause an inherent sampling error whenever the reclocking frequency is offset from the input data frequency.

Figure 6:
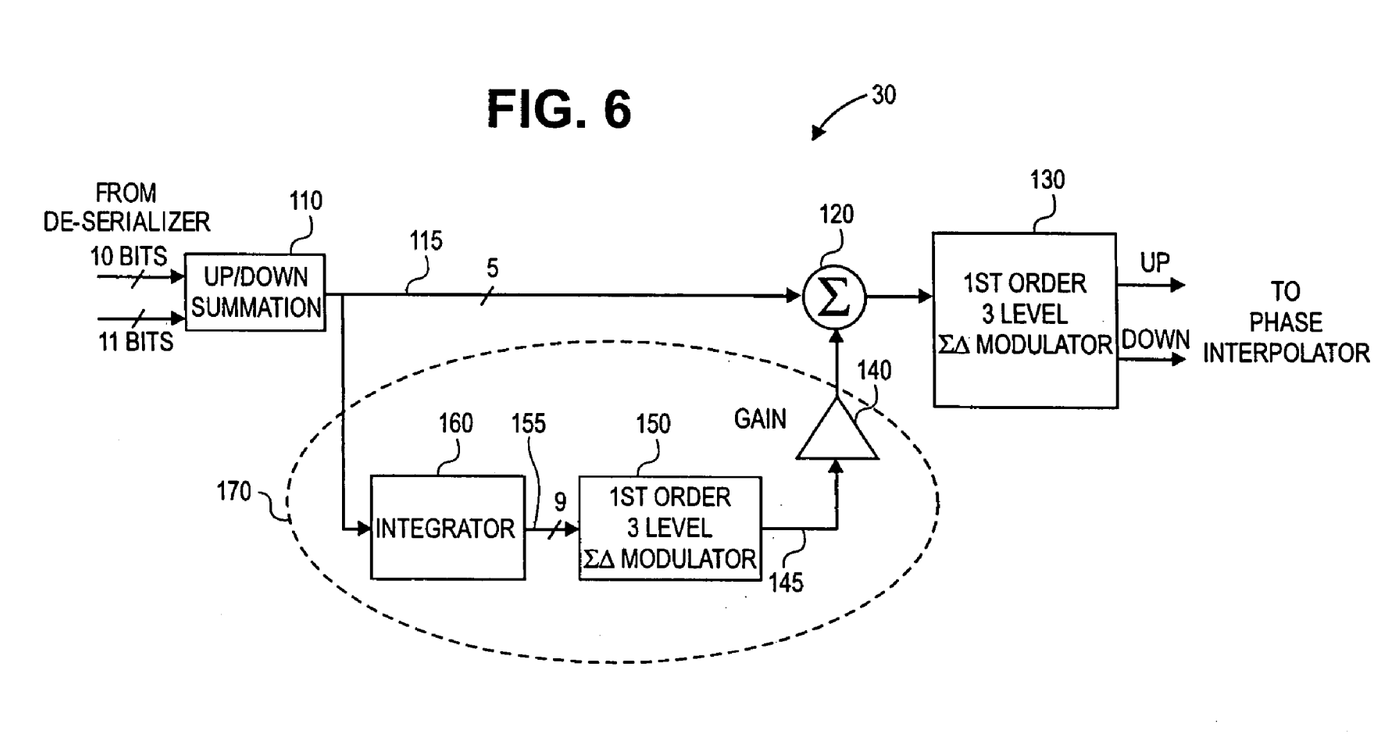
FIG. 6 is a diagram of a clock recovery loop filter in accordance with an embodiment of the present invention.

An alternative approach is to include a second order digital filter in the clock recovery loop filter 30. Turning to FIG. 6, a clock recovery loop filter 30 is shown having a second order digital filter 170. The clock recovery loop filter 30 includes an up/down summation circuit 110. In the case of the de-serialization circuit 20 producing 21 bits of data from the serial data input, the 21 bits of data is received by the up/down summation circuit 110. Using a method such as the method described above to determine whether to increase or decrease the phase, the up/down summation circuit 110 analyzes the 21 bits of data to determine whether the phase of the reclocking signals, I' and Q', needs to go up or go down. The summation circuit adds a +1 for every sequence of bits that indicates that the phase of the reclocking signal needs to go up, and adds a −1 for every sequence that indicates that the phase needs to go down. Thus, for 21 bits of data, the output 115 of the summation circuit 110 may have a 5 bit value ranging from −10 to +10, which is the average of the ups and downs.

The output 115 of the summation circuit 110 is then fed into the second order filter loop 170, which may include an integrator 160. The integrator 160 cumulates the outputs 115 of the summation circuit 110 and generates a 9 bit output for a $1^{st}$ order, 3 level, $\Sigma\Delta$ modulator 150, which is a $1^{st}$ order digital filter having a down threshold, an up threshold, and a three level output, e.g., +1, 0, and −1. The $\Sigma\Delta$ modulator 150 will cumulate the outputs of the integrator 160, and if the cumulated value reaches the down threshold, then the modulator 150 will subtract the down threshold from the value and send out one of the levels, e.g., −1. If the cumulated value reaches the up threshold, then the modulator 150 will subtract the up threshold from the value and send out one of the other levels, e.g., +1. If the cumulated value has not reached either threshold, then the modulator 150 will send out the third level, e.g., 0. The output of the modulator 150 is fed into a gain 140, e.g., a multiplier, and then summed 120 with the output 115 of the up/down summation circuit 110. The result of the summation 120 is then fed into another $1^{st}$ order, 3 level, $\Sigma\Delta$ modulator 130, having a down threshold, an up threshold, and a three level output, e.g., +1, 0, −1, which are the control signals to increase, decrease, or maintain the phase of the reclocking signals, I' and Q'. The $\Sigma\Delta$ modulators 150, 130 perform further averaging of the up and down signals coming from the up/down summation circuit 110, which, as can be appreciated by one of ordinary skill in the art, allows the clock recovery filter 30 to generate control signals that improve the tracking of any frequency offset when there are no transition points in the input data.

Further, with the approach described above, if there is a frequency offset between the reclocking signals and the input data, and if there is a long period where the input data locks at one value and has no transition points, the $2^{nd}$ order filter 30 may keep track of the offset. If the input data has no transition points, then the up/down summation circuit 110 will generate zero at its output 115. Thus, the integrator 160 will generate a constant valued output 155, since only zeros will be cumulated. The constant value is the cumulated value before the input data locked at one value and is proportional to the frequency offset between the reclocking signals and the input data. Thus, the frequency offset is stored within the integrator 160 when there are no transition points in the input data.

The increasing/decreasing control signals, i.e., up signals or down signals, that the clock recovery loop filter 30 generates is fed into the phase interpolator 40, which generates the reclocking signals, I' and Q'. The phase interpolator 40 receives two clock signals, Iref and Qref, that each have a frequency around half of the input data frequency, e.g., if the input data frequency is 1 GHz, then Iref and Qref would each have a frequency of around 500 MHz. For precise signals, the clocking signals, Iref and Qref, may be generated by a separate phase locked loop which uses a quartz crystal or a precision oscillator as a reference frequency (not shown). Just like the reclocking signals, I' and Q', upward and downward transitions of Iref and Qref are separated by a phase of 180°, and Iref and Qref are separated by a phase of 90°. The phase interpolator 40 receives the control signals from the clock recovery loop filter 30 and accordingly generates the reclocking signals I' and Q' by adjusting their phase relative to the phase of Iref and Qref.

Figure 7:
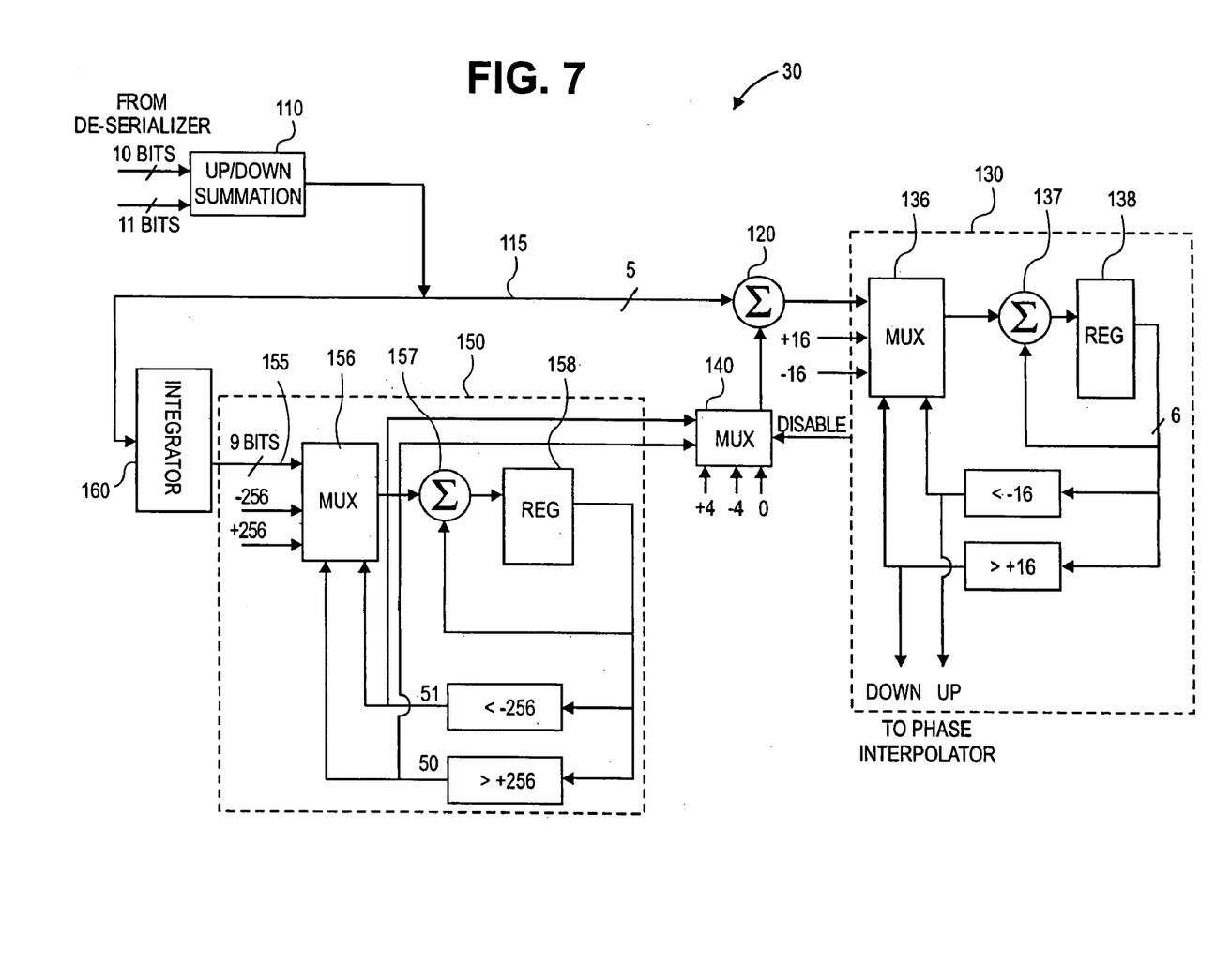
FIG. 7 is a diagram of another clock recovery loop filter in accordance with an embodiment of the present invention.

Turning to FIG. 7, an example implementation of the clock recovery filter of FIG. 6 is shown. A $\Sigma\Delta$ modulator 150 may include a multiplexer (mux) 156 that will either pass the output 155 of the integrator 160, or one of the threshold values, +256, −256, to be summed 157 with the value of a register 158. The result of the summation 157 is then stored into the register 158. The up threshold S1 is programmed at −256, and the down threshold S0 is programmed at +256. If the value in the register 158 does not reach any threshold, then neither S1 nor S0 will be passed to the mux 156, and the mux 156 will pass the output 155 of the integrator 160 to be summed 157. Further, mux 140 will pass a 0 to the summation circuit 120. Mux 140 is an implementation of the gain 140 in FIG. 6. The mux 140 is programmed to send a gain of 4, i.e., if a down signal S0 is sent to the mux 140, then the mux 140 will pass a −4.

If the up threshold S1 is reached, wherein the value in the register 158 is less than −256, then S1 triggers the mux 156 to pass +256 to the summation 157—which will add +256 to the value in the register 158. S1 will also trigger the mux 140 to send a +4 to the summation circuit 120. If the down threshold S0 is reached, i.e., when the value of the register 158 is greater than +256, then S0 will trigger the mux 156 to pass −256 to the summation 157, which will add −256 to the value in the register 158. Further, as described above, S0 will also trigger the mux 140 to send a −4 to the summation circuit 120.

The $\Sigma\Delta$ modulator 130 may be implemented in a similar manner. The up threshold is programmed at −16 and the down threshold is programmed at +16. If the value of register 138 is greater than +16, then the clock recovery filter 30 will send a down control signal to the phase interpolator 40 to decrease the phase of the reclocking signals. The mux 136 will also pass a −16 to be summed 137 with the value in register 138 to be stored back into the register 138. If the value of the register 138 is less than −16, then the clock recovery filter 30 will send an up control signal to the phase interpolator 40 to increase the phase of the reclocking signals. The mux 136 will also pass a +16 to be summed 137 with the value in the register 138 to be stored back into the register 138. If the value of the register 138 is between +16 and −16, then the mux 136 will pass the output of the summation circuit 120 to be cumulated 137 into the register 138.

As described above, some of the parameters of the clock recovery filter 30 are programmable, which allows the characteristics of the clock recovery filter 30 to be optimized. For example, in some system applications, the frequency of the input data may wander. In such a case, it may be desirable to increase the corner frequency of the clock recovery filter 30 to be able to track the wandering frequency at the expense of allowing more high frequency jitter or noise in. As can be appreciated by one of ordinary skill in the art, to increase the corner frequency, the thresholds S1 and S0 of the $\Sigma\Delta$ modulator 150 may be programmed to lower levels.

Likewise, in some applications, the input data frequency may be stable, and thus, it may be desirable to decrease the corner frequency of the clock recovery filter 30 to minimize the transfer of high frequency jitter or noise, which may be achieved by programming the thresholds S1 and S0 of the ΣΔ modulator 150 to higher levels. As described above, with a $2^{nd}$ order digital filter 170, frequency tracking is improved, even if there is a frequency offset between the reclocking signals and the input data. Thus, the corner frequency of the clock recovery filter 30 may be reduced compared to a clock recovery filter having a conventional first order digital filter, thus reducing the amount of high frequency jitter or noise transferred and improving the BER.

Figure 8:
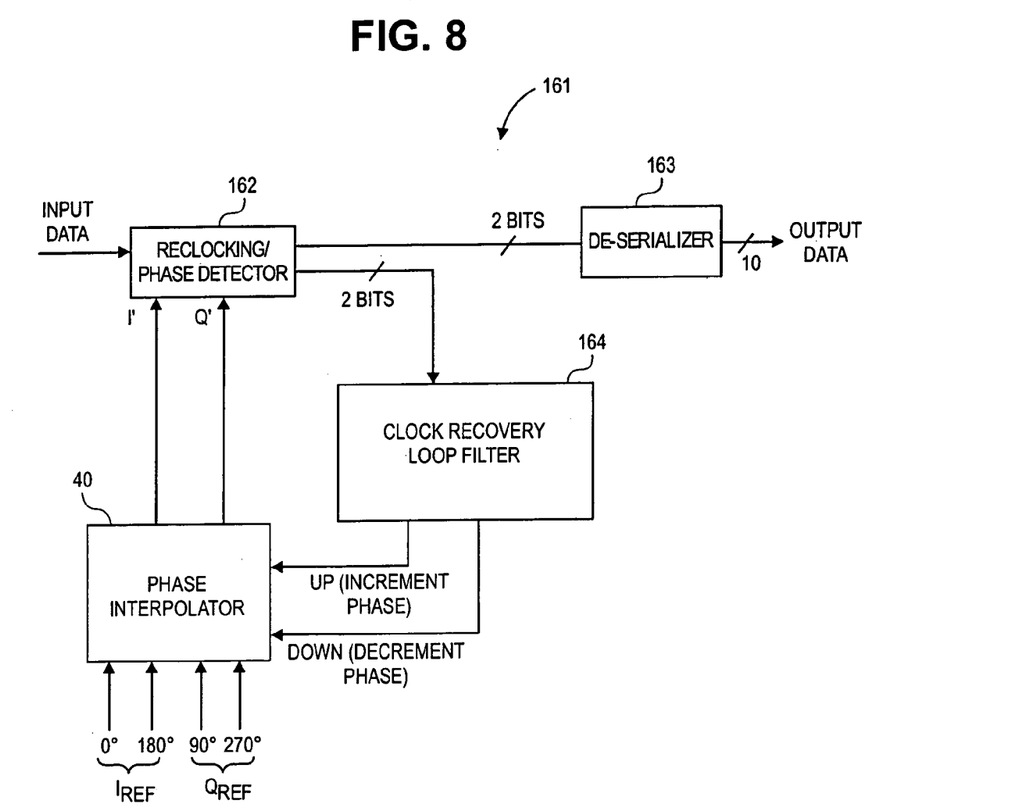
FIG. 8 is a diagram of an alternative clock recovery circuit in accordance with an embodiment of the present invention.

An alternative clock recovery circuit constructed in accordance with an embodiment of the present invention is shown on FIG. 8. The input data is received by a reclocking/phase detecting module 162 that reclocks the input data and provides information to detect the phase difference between the reclocking signals, I' and Q', and the input data. The reclocking/phase detecting module 162 provides a two bit output, which preferably represents the data value of the input data signal, for a deserializer 163. The deserializer 163 deserializes the two bits into a 10 bit parallel data stream, similar to the deserializer 20 described in clock recovery circuit 10 in FIG. 2. The reclocking/phase detecting module 162 provides an additional two bit output, which preferably represents the transition points of the input data signal, for a clock recovery loop filter 164. The clock recovery loop filter 164 provides Up and Down control signals to a phase interpolator 40 to adjust the reclocking signals, I' and Q', similar to the clock recovery loop filter 30 in FIG. 2.

Figure 9:
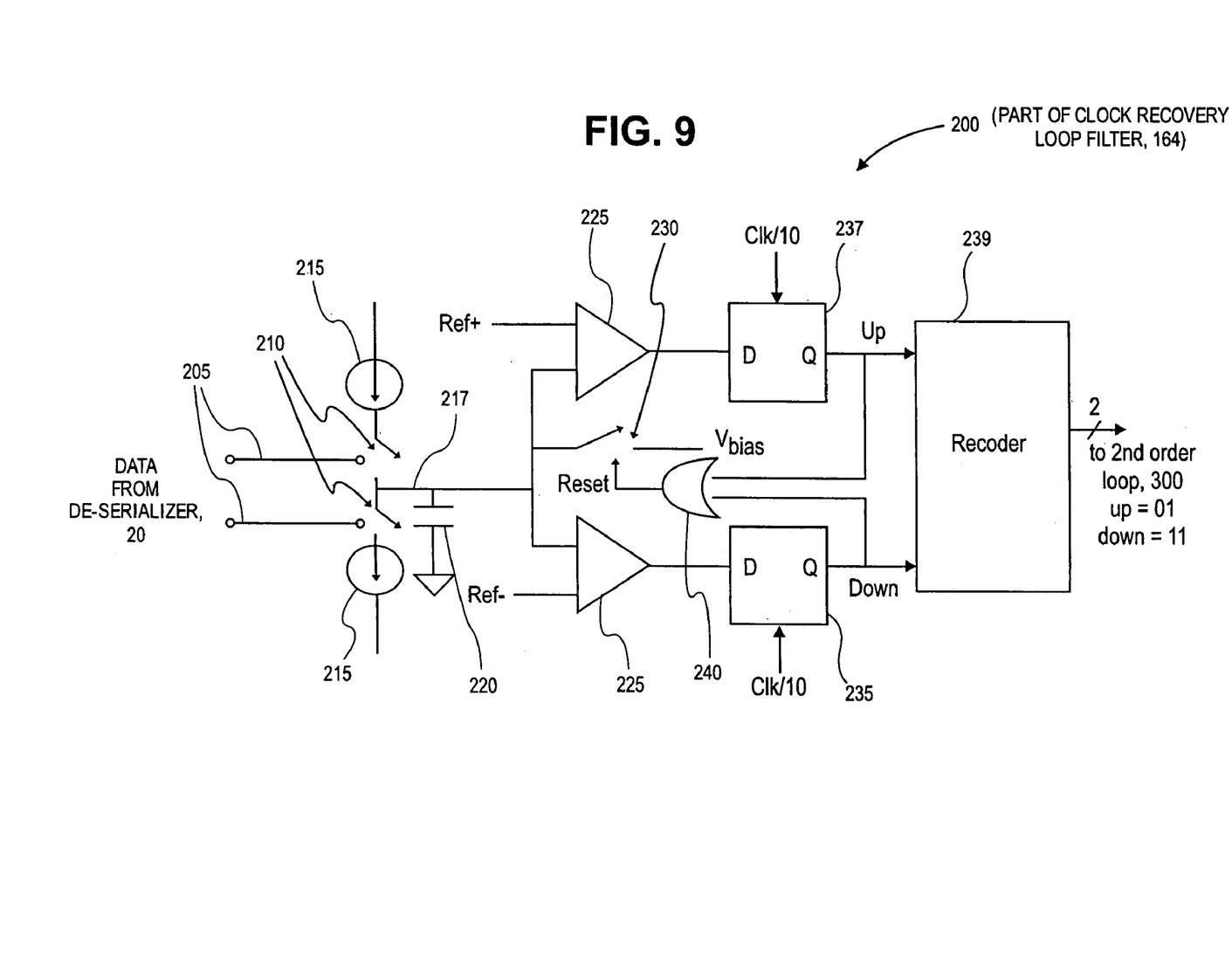
FIG. 9 is a diagram of part of an alternative clock recovery loop filter in accordance with an embodiment of the present invention.
Figure 10:
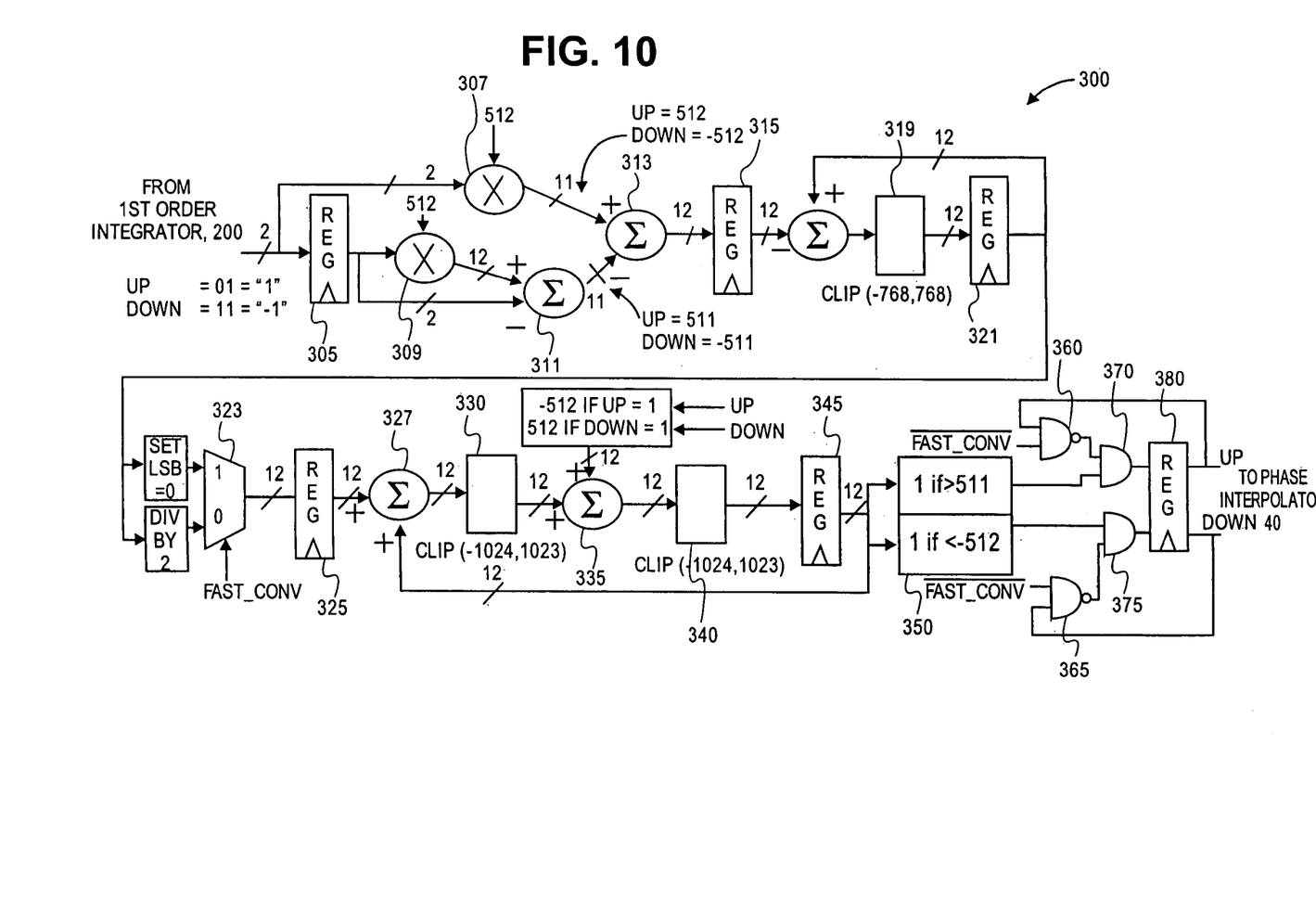
FIG. 10 is a diagram of part of an alternative clock recovery loop filter in accordance with an embodiment of the present invention.

Turning to FIGS. 9 and 10, an implementation of the clock recovery loop filter 164 is constructed in accordance with an embodiment of the present invention. Turning to FIG. 9, a $1^{st}$ order integrator 200 receives the two bit output from the reclocking/phase detecting module 162 as control signals 205 that control two switches 210, e.g., if one of the control signals 205 is 1, then the top switch 210 will close, and if the other of the control signals 205 is 1, then the bottom switch 210 will close. Each switch 210 is coupled to a current source 215. The signal 217 from the switches 210 is coupled to an integration capacitor 220 that integrates the currents from the current sources 215. The signal 217 then enters two comparators 225, each having a reference voltage, Ref+ and Ref−. If the signal 217 reaches the value of Ref+, then a 1 will enter flip-flop 237, which is controlled by clock signal, Clk/10, which, in the case of input data de-serialized by a factor of 10 as described above, is one-tenth the frequency of the input data. If the signal 217 has not reached Ref+, then a 0 will enter flip-flop 237.

If the signal 217 reaches the value of Ref−, then a 1 will enter flip-flop 235, which is controlled by a clock signal, Clk/10, similar to the circuit in FIG. 2. Otherwise, a 0 will enter flip-flop 235. The outputs of the flip-flops 237/235 are coupled together via an OR gate 240, and the output of the OR gate 240 controls a RESET switch 230. If the RESET switch 230 is closed, then the signal 217 is set to Vbias, which may be approximately midway between the two voltages, Ref+ and Ref−. The outputs of the flip-flops 237/235 are also coupled with a recoder 239, which generates a two bit output to be received by a $2^{nd}$ order loop 300, which is shown on FIG. 10.

Turning to FIG. 10, as mentioned above, the two bit output of the $1^{st}$ order integrator 200 is then fed into a $2^{nd}$ order filter 300. If the value of the two bits is 01, this indicates that it may be desirable to shift the phase of the reclocking signals up, i.e., +1. If the value of the two bits is 11, then it may be desirable to shift the phase of the reclocking signals down, i.e., −1. The two bit value is then fed into a register 305 and multiplied 307 by 512. By placing the two bit value into the register 305, the two bit value is delayed by one clock cycle from the multiplication at 307. The output of the register 305 is then multiplied 309 by 512 and fed into a summation circuit 311, wherein the output of the register 305 is subtracted from the product 309 of the output of register 305 and 512. If the two bit value is 01, then the result is 511. If the two bit value is 11, then the result is −511. The result of the summation 311 is then subtracted 313 from the product 307 of the two bit value and 512, which will either be 512 if the two bit value is 01 or −512 if the two bit value is 11.

The result of subtraction 313 is then fed into register 315. The twelve bit output from register 315 is then subtracted 317 from the output of register 321. The result of the subtraction 317 is then fed into a clip circuit 319, which will clip the result of the subtraction 317 if the result were to exceed the ranges specified, i.e., −768 and 768. The output of the clip circuit 319 is then fed back into the register 321. As can be appreciated by one of ordinary skill in the art, the output of register 321 will have big spikes of large values within the data, which allows for a more stable loop.

The output of the register 321 is also fed into two logic circuits. One logic circuit will take the output and set the least significant bit (LSB) to 0. The other circuit will divide the output of register 321 by two. The outputs of these logic circuits are then fed into mux 323, which is controlled by a user-controlled signal, FAST_CONV. If the user wants the circuit 300 to function in "fast converge" mode, then the user will set FAST_CONV to 1 and accordingly the LSB of the output of register 321 will be set to zero. If the user sets the FAST_CONV to 0, then the output of register 321 will be divided by two.

The output of mux 323 is then fed into register 325, the output of which is then fed into a summation circuit 327, wherein the output of register 325 is summed 327 with the output of register 345. The output of summation 327 is then fed into clip circuit 330, having maximum ranges of −1024 and 1023. The output of the clip circuit 330 is then summed 335 with either −512 if the output of the filter 300, UP, is 1, or 512 if the output of the filter 300, DOWN, is 1. The output of summation 335 is then fed into clip circuit 340, having a range of −1024 and 1023. The output of clip circuit 340 is then fed into register 345, which is fed back into summation circuit 327, as described above, and fed into a threshold logic circuit 350. If the output of the register 345 is more than 511, then the logic circuit 350 will send a 1 to AND gate 370, which is coupled with a NAND gate 360 having as inputs the inverted value of FAST_CONV and the UP control signal out of register 380. If the output of register 345 is less than −512, then the logic circuit will send a 1 to AND gate 375, which is coupled with NAND gate 365, having as its inputs the inverted value of FAST_CONV and the DOWN control signal out of register 380. The outputs of the AND gates 370 and 375 are fed into register 380. The UP and DOWN control signals are then passed to the phase interpolator to accordingly adjust the phase of the reclocking signals, I' and Q'.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagram described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for recovering data from a serial bit data stream, having a frequency, comprising the steps of:
   regenerating at least one reclocking signal, having a frequency with a phase, to reclock the serial bit data stream;
   determining whether the at least one reclocking signal is reclocking the serial bit data stream at an optimum point within the serial bit data stream;
   if there is a frequency offset between the at least one reclocking signal and the serial bit data stream and if the serial bit data stream locks onto one value, then storing the frequency offset; and
   generating at least one control signal to adjust the phase of the frequency of the at least one reclocking signal to reclock at substantially near the optimum point.

2. The method of claim 1, further comprising the step of de-serializing the serial bit data stream.

3. The method of claim 1, further comprising the step of adjusting the phase of the at least one reclocking signal in accordance with the at least one control signal.

4. The method of claim 3, further comprising the step of averaging the at least one control signal before adjusting the phase of the at least one reclocking signal.

5. The method of claim 1, wherein the at least one reclocking signal is two reclocking signals, in-phase and quadrature.

6. The method of claim 5, wherein the step of determining whether the in-phase and quadrature reclocking signals are reclocking the serial bit data stream at an optimum point within the serial bit data stream is executed by detecting the phase of the in-phase and quadrature reclocking signals in parallel.

7. A system for recovering data from a serial bit data stream, having a frequency, comprising:
   a means for regenerating at least one reclocking signal, having a frequency, to reclock the serial bit data stream;
   a means for determining whether the at least one reclocking signal is reclocking the serial bit data stream at an optimum point within the serial bit data stream;
   a means for storing the frequency offset if there is a frequency offset between the at least one reclocking signal and the serial bit data stream and if the serial bit data stream locks onto one value; and
   a means for generating at least one control signal to adjust the phase of the frequency of the at least one reclocking signal to reclock at substantially near the optimum point.

8. The system of claim 7, further comprising a means for de-serializing the serial bit data stream.

9. The system of claim 7, further comprising a means of adjusting the phase of the at least one reclocking signal in accordance with the at least one control signal.

10. The system of claim 9, further comprising the step of averaging the at least one control signal before adjusting the phase of the at least one reclocking signal.

11. The system of claim 7, wherein the at least one reclocking signal is two reclocking signals, in-phase and quadrature.

12. The system of claim 11, wherein the step of determining whether the in-phase and quadrature reclocking signals are reclocking the serial bit data stream at an optimum point within the serial bit data stream is executed by detecting the phase of the in-phase and quadrature reclocking signals in parallel.

13. A clock recovery circuit comprising:
   a clock recovery loop filter comprising a second order filter;
   wherein said clock recovery loop filter is adaptable to determine whether a reclocking signal is reclocking a stream of data at an optimum location; and
   wherein said second order filter is adaptable to track the frequency offset if there is a frequency offset between the stream of data and the reclocking signal and if the stream of data locks onto one value.

14. The circuit in claim 13, wherein the second order filter further comprises a first order sigma delta modulator adaptable to average signals that adjust the phase of the reclocking signal.

15. A circuit for recovering data from a serial bit stream having a frequency with a phase comprising:
   a de-serializer configured for reclocking the serial bit stream using at least one reclocking signal, having a frequency with a phase, and de-serializing the serial bit stream into at least two bit streams, the at least two bit streams comprising a first bit stream representing data values from the serial bit stream and a second bit stream representing transition points of the serial bit stream;
   a clock recovery loop filter coupled with the deserializer, configured for determining whether the de-serializer is reclocking the serial bit data stream at an optimum location and generating at least one control signal to adjust the phase of the frequency of the at least one reclocking signal if the de-serializer is not reclocking the serial bit data stream at the optimum location, wherein the clock recovery loop filter comprises a second order filter; and
   a phase interpolator coupled with the clock recovery loop filter and the de-serializer, configured for generating the at least one reclocking signal in accordance with the at least one control signal.

16. The circuit in claim 15, wherein the at least one reclocking signal is an in-phase reclocking signal and a quadrature reclocking signal.

17. The circuit in claim 16, wherein the in-phase reclocking signal and the quadrature reclocking signal have a phase difference of 90°.

18. The circuit in claim 16, wherein the phase of in-phase reclocking signal and the phase of the quadrature reclocking signal are detected in parallel.

19. The circuit in claim 15, wherein the second order filter comprises an integrator configured to store the frequency offset between the at least one reclocking signal and the serial bit data stream if there is a frequency offset between the at least one reclocking signal and the serial bit data stream and if the serial bit data stream locks at one value.

20. The circuit in claim 19, wherein the second order filter further comprises a first order sigma-delta modulator having an up threshold, a down threshold, and a register, and further wherein the sigma delta modulator sends an up pulse if the register reaches the up threshold and a down pulse if the register reaches the down threshold.

21. The circuit in claim 20, wherein the second order filter has corner frequencies and the corner frequencies are programmable by adjusting the up and down thresholds.

22. The circuit in claim 15, wherein the second order filter has corner frequencies and the corner frequencies are programmable.

23. The circuit of claim 15, wherein the second order filter is digital.

24. The circuit of claim 15, wherein the de-serializer is configured for de-serializing the serial bit data stream into at least 21 bit streams.

25. The circuit of claim 24, wherein the at least 21 bit streams each have a frequency that is no more than one-tenth frequency of the serial bit data stream.

* * * * *

UNITED STATES PATENT AND TRADEMARK OFFICE
CERTIFICATE OF CORRECTION

PATENT NO.         : 7,127,017 B1                                    Page 1 of 1
APPLICATION NO.    : 10/198899
DATED              : October 24, 2006
INVENTOR(S)        : Evans et al.

It is certified that error appears in the above-identified patent and that said Letters Patent is hereby corrected as shown below:

On the Title page, at item (75) Inventors:

please insert as the last named inventor -- Mark Alan Summers, Raleigh, NC (US) --.

Signed and Sealed this

Twelfth Day of June, 2007

JON W. DUDAS
*Director of the United States Patent and Trademark Office*